(12) United States Patent
Crawley (10) Patent No.: US 10,060,954 B2
(45) Date of Patent: Aug. 28, 2018

(54) LOAD CAPACITANCE DETERMINATION CIRCUITRY AND POWER SUPPLY CONTROL

(71) Applicant: Fairchild Semiconductor Corporation, Sunnyvale, CA (US)

(72) Inventor: Philip J. Crawley, Oceanside, CA (US)

(73) Assignee: Fairchilf Semiconductor Corporation, Phoenix, AZ (US)

( * ) Notice: Subject to any disclaimer, the term of this patent is extended or adjusted under 35 U.S.C. 154(b) by 28 days.

(21) Appl. No.: 15/413,352

(22) Filed: Jan. 23, 2017

(65) Prior Publication Data

US 2017/0222557 A1    Aug. 3, 2017

Related U.S. Application Data

(60) Provisional application No. 62/288,703, filed on Jan. 29, 2016.

(51) Int. Cl.
*G01R 27/26* (2006.01)
*G01R 19/00* (2006.01)
(Continued)

(52) U.S. Cl.
CPC ........ *G01R 19/0038* (2013.01); *H02M 3/156* (2013.01); *G01R 27/26* (2013.01);
(Continued)

(58) Field of Classification Search
CPC ................ G01R 27/26; G01R 27/2605; G01R 19/0038; H02M 2001/0016;
(Continued)

(56) References Cited

U.S. PATENT DOCUMENTS

6,130,541 A * 10/2000 Ozguc ................ G01R 27/2605
323/315
2002/0196035 A1* 12/2002 Cho ..................... G11C 7/1051
324/678
(Continued)

*Primary Examiner* — Jue Zhang
*Assistant Examiner* — Jye-June Lee
(74) *Attorney, Agent, or Firm* — Dickinson Wright PLLC (57) ABSTRACT

Generally, this disclosure provides circuitry and methods for determining the output capacitance of an output load capacitor of a power supply. The output capacitance is generally determined by beginning a calibration period and charging an output capacitor with a current source to generate an output voltage. The output voltage may be compared to a reference voltage, and a time period is determined during which the output voltage is less than the reference voltage. The capacitance value, C, of the output capacitor may be determined based on, at least in part, the determined time period. This disclosure also provides circuitry and methods to adjust certain parameters of the power supply based on the determined C value. For example, in a ramp compensation portion of the power supply, the value of a ramp capacitor and/or reset resistor may be adjusted once the value of C is determined. This may enable, for example, increased efficiency, greater stability and increased bandwidth operation of the power supply when the output load capacitor is changed for different applications.

22 Claims, 8 Drawing Sheets

(51) Int. Cl.
*H02M 3/156* (2006.01)
*H02M 1/00* (2006.01)

(52) U.S. Cl.
CPC . *G01R 27/2605* (2013.01); *H02M 2001/0016* (2013.01); *H02M 2001/0025* (2013.01); *H02M 2003/1566* (2013.01)

(58) Field of Classification Search
CPC . H02M 2001/0025; H02M 2003/1566; H02M 3/156
See application file for complete search history.

(56) References Cited

U.S. PATENT DOCUMENTS

| | | | | |
|---|---|---|---|---|
| 2011/0050255 | A1* | 3/2011 | Iriarte | G01R 27/2605 324/679 |
| 2012/0098553 | A1* | 4/2012 | Karlsson | G01R 27/2605 324/684 |
| 2014/0266106 | A1* | 9/2014 | El-Nozahi | G05F 1/575 323/280 |
| 2014/0292300 | A1 | 10/2014 | Yan et al. | |
| 2017/0085174 | A1* | 3/2017 | Babazadeh | H02M 3/158 |

\* cited by examiner

LOAD CAPACITANCE DETERMINATION CIRCUITRY AND POWER SUPPLY CONTROL

CROSS REFERENCE TO RELATED APPLICATIONS

This application claims the benefit of U.S. Provisional Patent Application Ser. No. 62/288,703, filed Jan. 29, 2016, the entire content of which is incorporated herein by reference.

FIELD

The present disclosure relates to determining output capacitance of an output load capacitor of a power supply, and to using the output capacitance value to adjust various operational parameters of the power supply.

BACKGROUND

Switched mode power supply topologies are well known. Typically, for a particular application, an output load capacitor and output inductor are selected and added to the output stage of the power supply. For the vast majority of applications, the inductance value does not vary significantly, but the output capacitance can vary 1000-fold. The output capacitance can have significant impact on the stability and bandwidth of the power supply, and since the output capacitor is typically a user-changeable item, the effects of changing the output capacitor to suit another application usually impacts the efficiency and operation of the power supply. In addition, typical power supplies do not provide any mechanism to change certain key component values when an output capacitor is changed, thus limiting the ability to compensate the power supply when the output capacitor is initially installed and/or changed.

BRIEF DESCRIPTION OF DRAWINGS

Features and advantages of the claimed subject matter will be apparent from the following detailed description of embodiments consistent therewith, which description should be considered with reference to the accompanying drawings, wherein:

Although the following Detailed Description will proceed with reference being made to illustrative embodiments, many alternatives, modifications, and variations thereof will be apparent to those skilled in the art.

DETAILED DESCRIPTION

Generally, this disclosure provides circuitry and methods for determining the output capacitance of an output load capacitor of a power supply. The output capacitance is generally determined by beginning a calibration period and charging an output capacitor with a current source to generate an output voltage. The output voltage may be compared to a reference voltage, and a time period is determined during which the output voltage is less than the reference voltage. The capacitance value, C, of the output capacitor may be determined based on, at least in part, the determined time period. This disclosure also provides circuitry and methods to adjust certain parameters of the power supply based on the determined C value. For example, in a ramp compensation portion of the power supply, the value of a ramp capacitor and/or reset resistor may be adjusted once the value of C is determined. This may enable, for example, reduced ripple, improved step response, and greater stability operation of the power supply when the output load capacitor is changed for different applications.

I. Determining Output Load Capacitance

Figure 1:
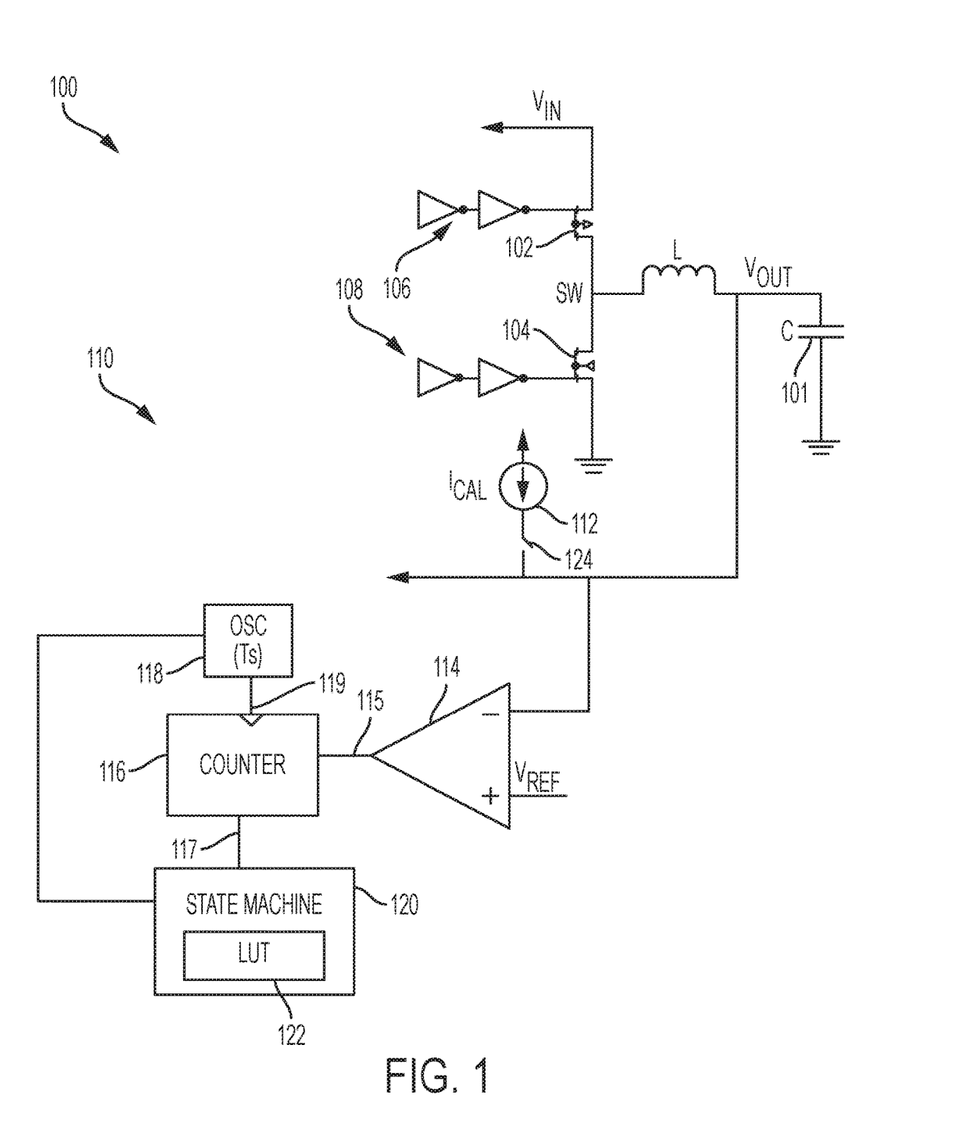
FIG. 1 illustrates a power supply system according to one embodiment of the present disclosure.

FIG. 1 illustrates a power supply system 100 according to one embodiment of the present disclosure. The power supply system 100 of FIG. 1 depicts certain known elements of a conventional switched mode power supply including power switches 102 and 104 and associated driver circuitry 106 and 108, respectively. In addition, the power supply system 100 of FIG. 1 depicts certain known output elements of a conventional switched mode power supply including output transformer, L, and output capacitor 101. It should also be understood that load circuitry (not shown) may be coupled to the output voltage Vout. Other elements of a known switched mode power supply have been omitted from FIG. 1 for clarity. As is well known, the power supply 100 may be generally configured to provide power for a wide range of applications, and the output transformer, L, and output capacitor 101 may be selected for a given application. The capacitance value, C, of a given output capacitor 101 may exert influence over the operation of the power supply 100, and thus, determining C may enable more efficient operation of the power supply 100. The following detailed description is provided in reference to determining the output load capacitance, C, for a hysteretic switched mode DC/DC converter power supply, for example, a buck power supply, boost, buck-boost, half bridge, full bridge, Sepic, etc., and/or current mode power supply topologies, and thus this disclosure should not be read as limited to any particular type of known or after-developed switched mode power supply topology.

According to the teachings of the present disclosure, the power supply system 100 also includes output capacitor determination circuitry, shown generally at 110. The output capacitor determination circuitry 110 of this embodiment includes current source circuitry 112 to generate a reference current, Ical, to controllably charge the output capacitor 101 to generate an output voltage, Vout, that ramps up across the output capacitor 101. The output capacitor determination circuitry 110 of this embodiment also includes comparator circuitry 114 generally configured to compare Vout to a reference voltage, Vref, and generate an enable signal 115. The output capacitor determination circuitry 110 of this embodiment also includes counter circuitry 116 and clock circuitry 118 to generate a clock signal 119 having a period Ts. The counter circuitry 116 is generally configured to provide a count, N, representing the number of counts (as a function of Ts) of the enable signal 119. The output capacitor determination circuitry 110 of this embodiment also includes state machine circuitry 120 generally configured to determine the capacitance value, C, of the output capacitor 101 based on Ts, N, Vref and Ical, as will be explained in greater detail below.

The output capacitor determination circuitry 110 of this embodiment may be enabled during a calibration period to determine C. The calibration period may be before other portions of the power supply system 100 are active, for example at each start up period of the power supply system 100. In other embodiments, once the value of C has been determined (as described herein) for a given output capacitor 101, the output capacitor determination circuitry 110 may be disabled until, for example, the output capacitor 101 is changed and another calibration period may be enabled. Accordingly, the output capacitor determination circuitry 110 of this embodiment may also include an enable switch 124 which is controlled to a conduction state to begin the calibration period and to enable the reference current, Ical, to charge the output capacitor 101 and generate Vout. The state of the enable switch 124 may be automatically enabled at startup and/or user-programmable to provide control over when a calibration period occurs.

In operation, and during a calibration period (e.g., switch 124 is conducting), the current source 112 charges the output capacitor 101 to generate the output voltage Vout. Vout generally ramps up from approximately zero volts (or other reference voltage) when the output capacitor 101 is charging. While Vout is ramping up, comparator circuitry compares Vout to the reference voltage Vref. While Vout is less than Vref (Vout<Vref), enable signal 115 is high, and when Vout is greater than Vref (Vout>Vref) the enable signal 115 is low. While the enable signal 115 is high, counter circuitry 116 increments a counter for each clock pulse period (Ts). When the enable signal 115 transitions from high to low, counter circuitry 116 stops the counter and generates a count signal 117 representing the number of counts, N, that have accumulated during the time the enable signal 115 was high. State machine circuitry 120 is configured to determine the capacitance value, C, of the output capacitor 101 based on the following equation:

$$C=(N*Ts*Ical)/Vref \qquad \text{EQ. 1}$$

Since N is a quantized value as a function Ts (the period of the clock pulse generated by clock circuitry 118), the state machine circuitry 120 may select the N value that occurs immediately before the transition of the enable signal (high to low). In some embodiments, the state machine circuitry 120 may include a look-up table (LUT) 122 to correlate N values with C values (by precalculating the equation above for a range of Ts, Ical and Vref values). Thus, each N value can generate a unique value for C. In other embodiments, the size of the LUT 122 may be reduced by correlating C values to a range of N values. Thus, for example, $N_{50}$-$N_{100}$ (meaning N count 50 through N count 100) may be correlated to a single C value, $C_1$. Continuing this example, $N_{101}$-$N_{200}$ may be correlated to $C_2$, $N_{201}$-$N_{400}$ may be correlated to $C_3$, etc. In the preceding example, the LUT 122 may be correlated using a quasi-logarithmic range of N values, and it should be recognized that other relationships may be used to group ranges of N values, for example, geometric relationships, linear relationship, etc. The accuracy of the determined C value may depend, at least in part on Ts. As a general matter, smaller values of Ts (higher frequency of the clock pulse) may result in increased accuracy of the determined C value, but may increase the cost and complexity of selected components. In addition, as a general matter, larger values of Vref may increase the accuracy of the C determination (since Vout will take longer to ramp up to Vref, and thus Ts*N will be larger), but increasing values of Vref may cause the load circuitry (not shown) to exert a greater influence over the determined C value. Accordingly, Vref may be selected to be low enough to minimize load effects and large enough to maximize C determination accuracy. In some embodiments, and for a typical implementation, the value of Vref may be in the range of, for example, 100 mV. To 1 V., and may be based the load characteristics such that the reference voltage is selected such that load current effects are minimized Once the enable signal 115 transitions from high to low, the current source 112 may be disabled (via, for example, opening of switch 124) and the counter 116 may be reset to stop the calibration period, which may enable the power supply system 100 to supply power to the load circuitry (not shown) as intended.

Figure 2A:
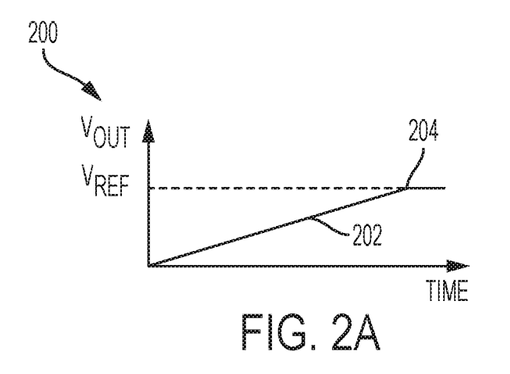
FIG. 2A illustrates a graph of Vout ramping up as the output capacitor of FIG. 1 is charging.
Figure 2B:
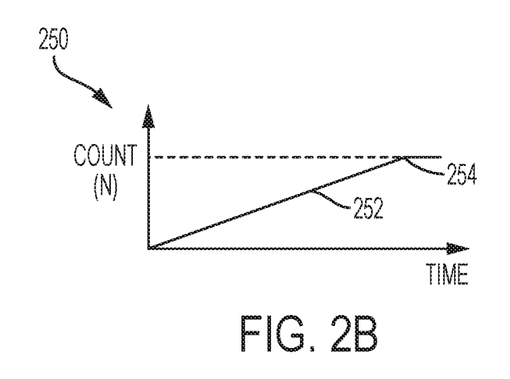
FIG. 2B illustrates a graph of N as Vout is ramping up.

With continued reference to FIG. 1, FIG. 2A illustrates a graph 200 of Vout 202 ramping up as the output capacitor 101 is charging. As illustrated in FIG. 2, Vout ramps up from zero volts (or a nominal voltage value) to Vref. At point 204, when Vout is equal to (or greater than) Vref, the charging of the output capacitor 101 is disabled. With continued reference to FIG. 1, FIG. 2B illustrates a graph 250 of N 252 as Vout is ramping up. The value of N 252 is incrementing as Vout 202 ramps up, and point 254 illustrates the final (and largest) count value N. Point 254 coincides with point 204, i.e., when Vout is equal to (or greater than) Vref.

The embodiment of FIG. 1, therefore, generally determines C during a ramp up period of Vout. Such a determination of C may be sufficiently accurate for some implementations, however, it should be noted that the load circuitry (not shown) coupled to the output capacitor 101 may influence the determined value for C. For example, depending on the load characteristics, the load circuitry may cause Vout to ramp up more slowly than if the output capacitor were isolated, which may cause the determined value of C to be larger than the actual value of C.

Figure 3:
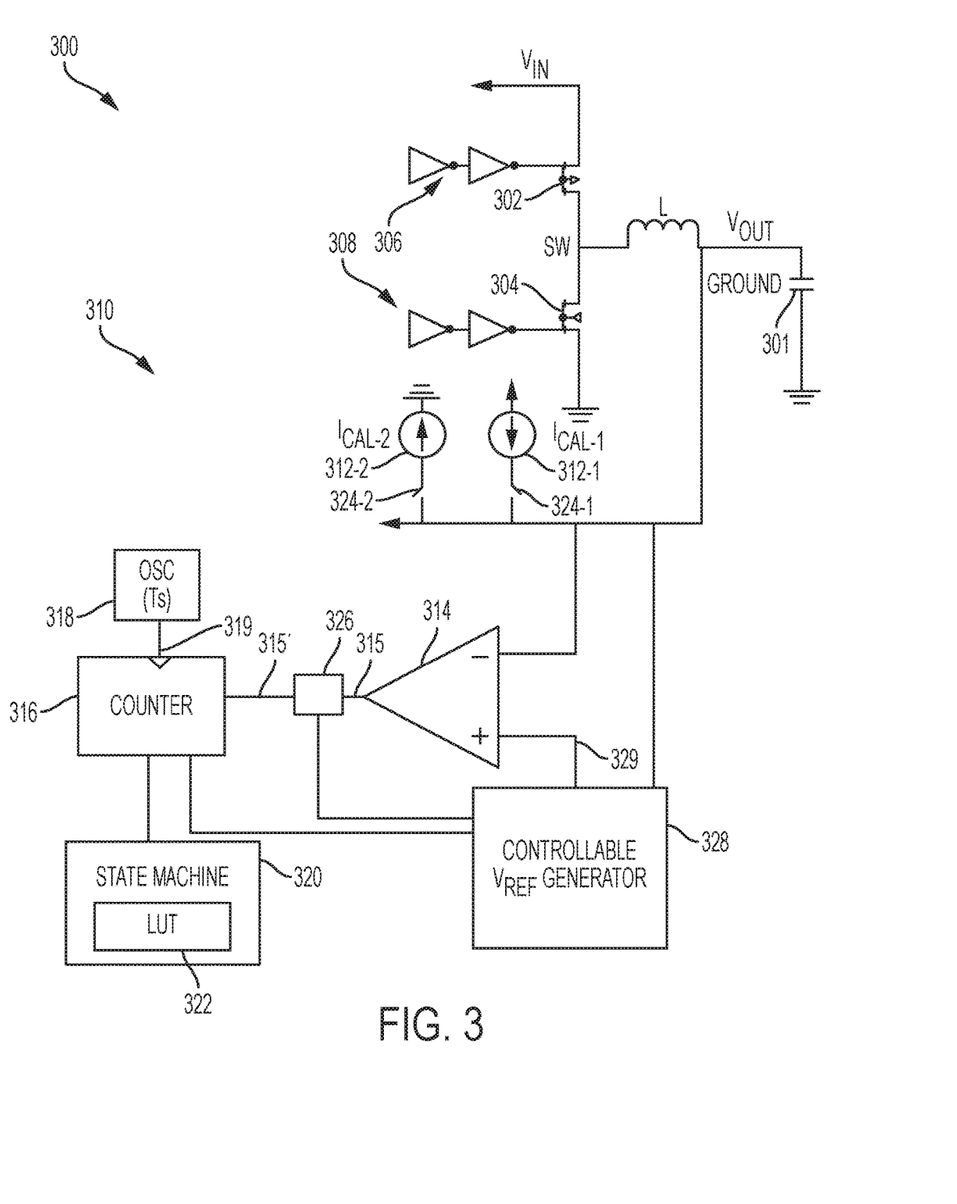
FIG. 3 illustrates a power supply system according to another embodiment of the present disclosure.

Accordingly, FIG. 3 illustrates a power supply system 300 according to another embodiment of the present disclosure. Similar to the embodiment of FIG. 1, the power supply system 300 of FIG. 3 depicts certain known elements of a conventional switched mode power supply including power switches 302 and 304 and associated driver circuitry 306 and 308, respectively. In addition, the power supply system 300 of FIG. 3 depicts certain known output elements of a conventional switched mode power supply including output transformer, L, and output capacitor 301. It should also be understood that load circuitry (not shown) may be coupled to the output voltage Vout. Other elements of a known switched mode power supply have been omitted from FIG. 3 for clarity. As is well known, the power supply 300 may be generally configured to provide power for a wide range of applications, and the output transformer, L, and output capacitor 301 may be selected for a given application. The capacitance value, C, of a given output capacitor 301 may exert influence over the operation of the power supply 300, and thus, determining C enables better performing operation of the power supply 300. The following detailed description is provided in reference to determining the output load capacitance, C, for a hysteretic switched mode DC/DC converter power supply, for example, a buck power supply, boost, buck-boost, half bridge, full bridge, Sepic, etc., and/or current mode power supply, and thus this disclosure should not be read as limited to any particular type of known or after-developed switched mode power supply topology.

According to the teachings of the present disclosure, the power supply system 300 also includes output capacitor determination circuitry, shown generally at 310. The output capacitor determination circuitry 310 of this embodiment includes first current source circuitry 312-1 to generate a first reference calibration current, Ical-1, to controllably charge the output capacitor 301 to generate an output voltage, Vout, that ramps up across the output capacitor 301. The output capacitor determination circuitry 310 of this embodiment includes second current source circuitry 312-2 to generate a second reference calibration current, Ical-2, to controllably discharge the output capacitor 301 to generate an output voltage, Vout, that ramps down across the output capacitor 301. The output capacitor determination circuitry 310 of this embodiment also includes controllable reference voltage circuitry 328 to generate a controlled reference voltage signal 329. The controlled reference voltage signal 329 may include a first reference voltage (Vmin) and a second reference voltage (Vmax), where Vmin<Vmax. The controllable reference voltage circuitry 328 includes comparator circuitry (not shown) to compare Vmin to Vout and to compare Vmax to Vout, and to generate Vmin or Vmax based on these comparisons. The output capacitor determination circuitry 310 of this embodiment also includes comparator circuitry 314 generally configured to compare Vout to the controlled reference voltage 329 and generate an enable signal 315. The output capacitor determination circuitry 310 of this embodiment also includes counter circuitry 316 and clock circuitry 318 to generate a clock signal 319 having a period Ts. The counter circuitry 316 is generally configured to provide a count, N, representing the number of counts (as a function of Ts) of the enable signal 319. The output capacitor determination circuitry 310 of this embodiment also includes controllable inverter circuitry 326 coupled between the comparator circuitry 314 and the counter circuitry 318 to control a state of the enable signal 315, as described below. The output capacitor determination circuitry 310 of this embodiment also includes state machine circuitry 320 generally configured to determine the capacitance value, C, of the output capacitor 301 based on Ts, N, Vref and Ical, as will be explained in greater detail below.

The output capacitor determination circuitry 310 may be enabled during a calibration period to determine C. The calibration period may be before other portions of the power supply system 300 are active, for example at each start up period of the power supply system 300. In other embodiments, once the value of C has been determined (as described herein) for a given output capacitor 301, the output capacitor determination circuitry 310 may be disabled until, for example, the output capacitor 301 is changed and another calibration period may be enabled. Accordingly, the output capacitor determination circuitry 310 of this embodiment may also include an enable switches 124-1 and 124-2 which are controlled to begin the calibration period and to enable the reference currents, Ical-1 and Ical-2, respectively, to charge the output capacitor 301 and generate Vout. The state of the enable switches 124-1 and/or 124-2 may be automatically enabled at startup and/or user-programmable to provide control over when a calibration period occurs.

As a general matter, the output capacitor determination circuitry 310 of this embodiment is enabled to determine C based on a combined ramp up count value (N1) and a ramp down count value (N2). By utilizing both a ramp up period of Vout and a ramp down period of Vout, load effects may be reduced or minimized and a more accurate value for C may be determined, as described in greater detail below.

Initial Start-Up of the Calibration Period

At the start of a calibration period, the controllable reference voltage circuitry 328 generates a minimum reference voltage signal (Vmin) and the first current source 312-1 is enabled to charge the output capacitor 301. Since the output capacitor 301 typically cannot be discharged accurately to zero volts because of the headroom necessary to generate an accurate current sink, Vmin provides a floor to determine the ramp up count value (N1) and the ramp down count value (N2). In other words, the N1 count value starts when Vout>Vmin and the N2 count value stops when Vout<Vmin. Therefore, Vmin may be selected based on, for example, load circuitry, estimated output capacitance, C, and/or other considerations, for example, selected based on the ability of the second reference current Ical-2 to discharge the output capacitor. During the initial start-up of the calibration period, while Vout<Vmin, the enable signal 315 is high. To prevent counting while Vout ramps up to Vmin, the controllable reference generator circuitry 328 enables the controllable inverter circuitry 326 to generate an inverted output 315' from the enable signal 315. In this state, 315' is low and the counter circuitry 316 does not begin counting.

Ramp-Up Counting Period to Generate Count N1

When Vout>Vmin, the controllable reference generator circuitry 328 stops generating Vmin and generates Vmax. Vmax is similar to Vref of the previous embodiment of FIG. 1. The comparator circuitry 314 compares Vout to Vmax and generates the enable signal 315. The enable signal 315 is high while Vout<Vmax and the controllable reference generator circuitry 328 controls the controllable inverter circuitry 326 to be a pass-through device (e.g., buffer) so that enable signal 315 is equal to signal 315'. Counter circuitry 316 provides a ramp-up count N1 while Vout<Vmax. When Vout>Vmax the controllable reference generator circuitry 328 generates a trigger signal to the counter circuitry 316 to signal the end of the ramp up count period, and counter circuitry 316 stores the highest count value as count N1. In addition, the first reference current 312-1 is disabled and the second reference current 312-2 is enabled to begin discharging the output capacitor 301.

Ramp-Down Counting Period to Generate N2

Once Vout>Vmax and the second reference current 312-2 is enabled, the controllable reference generator circuitry 328 generates Vmin and comparator circuitry 314 compares Vout to Vmin. While Vout>Vmin, the enable signal 315 is low. During this period the controllable reference generator circuitry 328 controls the controllable inverter circuitry 326 to generate an inverted output 315' (high). Counter circuitry 316 counts the ramp down count N2, until Vout<Vmin, at which time the N2 stops and is stored. Once Vout<Vmin, the second reference current 312-2 is disabled.

Determination of C Using N1 and N2

State machine circuitry 320 is configured to determine the capacitance value, C, of the output capacitor 301 based on the sum of the counts N1 and N2, as follows:

$$C=((N1+N2)*Ts*Ical\text{-}1)/2Vmax); \text{ where } Ical\text{-}1=Ical\text{-}2 \qquad \text{EQ. 2}$$

While it is possible to perform this computation on the IC another alternative is to adjust the LUT such that the count ranges verse method 1 are doubled. I.e. If $N_{50}$-$N_{100}$ (meaning N count 50 through N count 100) may be correlated to a single C value, $C_1$ in the first method, now $N_{100}$-$N_{200}$ is now correlated to $C_1$. Along that same line of reasoning, where before $N_{100}$-$N_{200}$ is now correlated to $C_2$ now $N_{200}$-$N_{400}$ correlates to $C_2$ Since N1 and N2 are quantized values as a function Ts (the period of the clock pulse generated by clock circuitry 318), the state machine circuitry 320 may select the N1 and N2 value that occurs immediately before the transition of the enable signal 315' (high to low). In some embodiments, the state machine circuitry 320 may include a look-up table (LUT) 322 to correlates the sum of N1 and N2 values with specific C values, respectively, (by precalculating the equation above for a range of Ts, Ical-1, Ical-2 and Vmax values). Thus, each sum of N1 and N2 value can generate a unique value for C. In other embodiments, the size of the LUT 322 may be reduced by correlating C values to a range of N values (for example, by doubling the ranges of the example described above with reference to FIG. 1). In the preceding example, the LUT 322 may be correlated using a quasi-logarithmic range of N values, and it should be recognized that other relationships may be used to group ranges of N values, for example, geometric relationships, linear relationship, etc. The accuracy of the determined C value may depend, at least in part on Ts. As a general matter, smaller values of Ts (higher frequency of the clock pulse) may result in increased accuracy of the determined C value, but may increase the cost and complexity of selected components. In addition, as a general matter, larger values of Vmax may increase the accuracy of the C determination (since Vout will take longer to ramp up to Vmax, and thus Ts*N will be larger), but increasing values of Vmax may cause the load circuitry (not shown) to exert a greater influence over the determined C value. Accordingly, Vmax may be selected to be low enough to minimize load effects and large enough to maximize C determination accuracy. In some embodiments, and for a typical implementation, the value of Vref may be in the range of, for example, 100 mV. To 1 V. and may be based the load characteristics such that the reference voltage is selected such that load current effects are minimized.

Figure 4A:
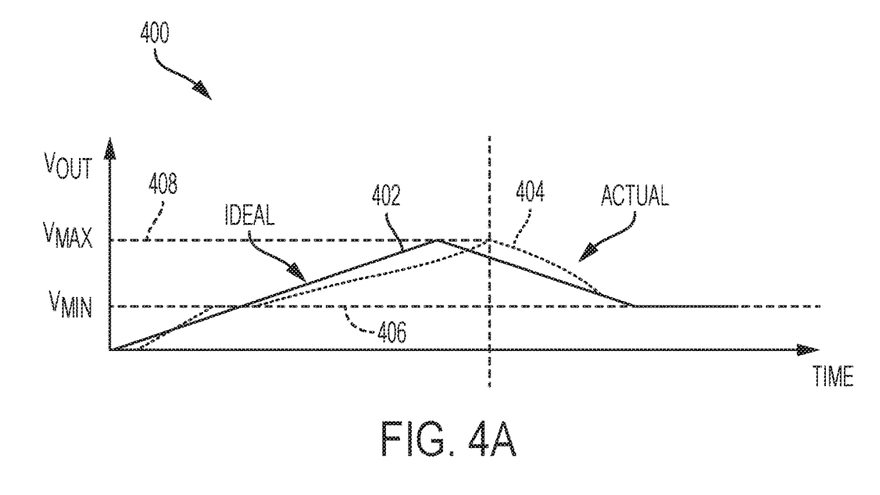
FIG. 4A illustrates a graph of an ideal Vout signal and an actual Vout signal of FIG. 3.
Figure 4B:
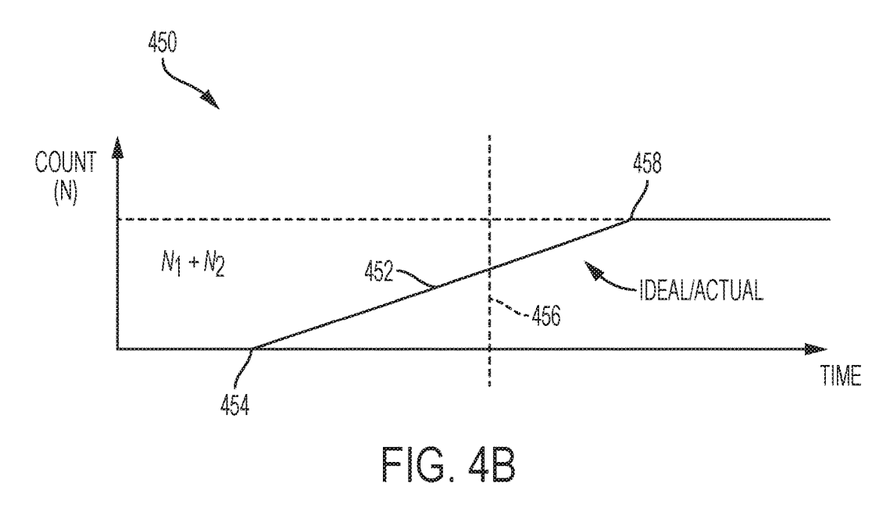
FIG. 4B illustrates a graph of the total count N1+N2 of Vout as Vout ramps up and ramps down.

With continued reference to FIG. 3, FIG. 4A illustrates a graph 400 of an ideal Vout signal 402 and an actual Vout signal 404. The "ideal" Vout signal 402 is representative of Vout for a typical output capacitor 301 being charged and discharged in isolation (e.g., no load effects) and the "actual" Vout signal 404 is representative of Vout for a typical output capacitor 301 being charged and discharged with load effects present, as described above. Vmax 408 and Vmin 406 are illustrated to show the boundaries of count operations, as described above. As illustrated by FIG. 4A, the ideal Vout signal 402 ramps up from zero Volts (or some nominal voltage) through Vmin 406 and to Vmax 408, and ramps down from Vmax 408 to Vmin 406. The actual Vout signal 404 similarly ramps up and ramps down, however, the load effects cause the ramp up portion to be "slower" than the ideal Vout signal 402, and the ramp down portion to be generally "faster" than the ideal Vout signal 402. With continued reference to FIG. 3, FIG. 4B illustrates a graph 450 of the total count N1+N2 452 of Vout as Vout ramps up and ramps down. The value of N1 is incrementing as Vout ramps up from Vmin at point 454 to Vmax at point 456, and the value of N2 is incremented as Vout ramps down from Vmax at point 456 to Vmin at point 458. Point 454 coincides with when Vout>Vmin, point 456 coincides with when Vout>Vmax and point 458 coincides with when Vout<Vmin. By averaging the ramp up and ramp down periods of Vout, as described above, the final actual count of N1+N2 closely matches the ideal count, since the N1 count may be overestimated during the ramp up portion and underestimated during the ramp down portion. Thus, the load effects, which may cause an error in the ramp up portion of Vout, may be reduced or eliminated.

Figure 5:
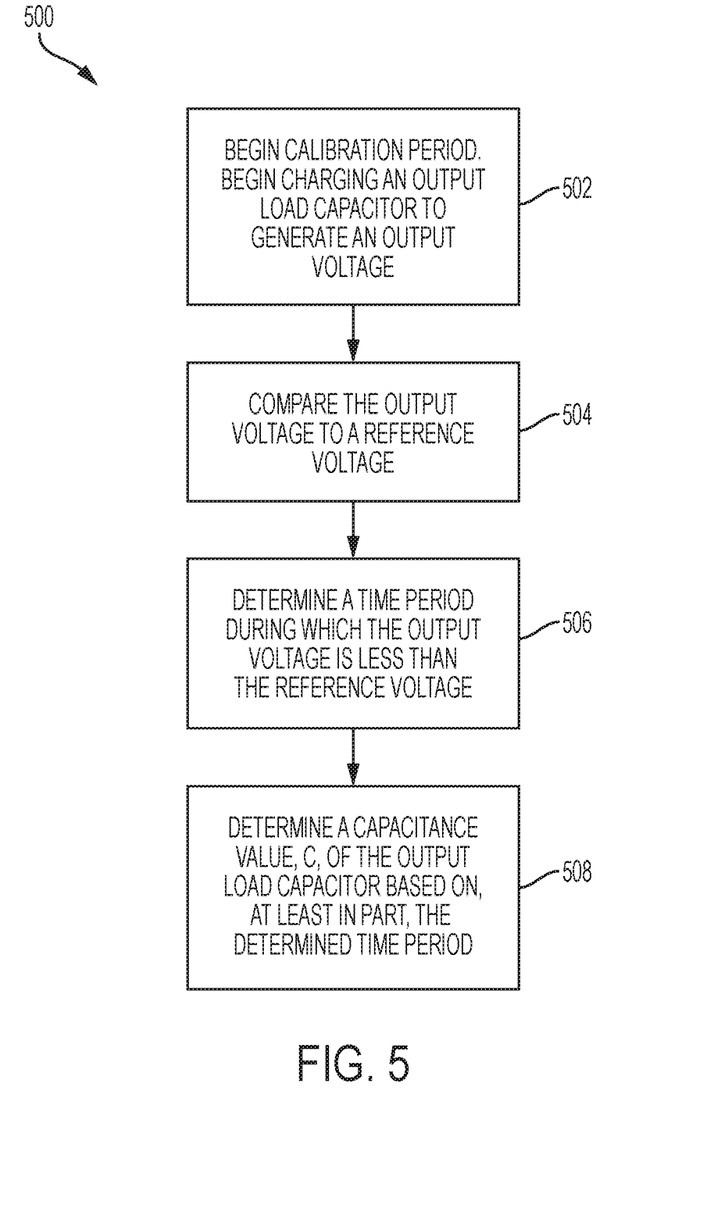
FIG. 5 is a flowchart of operations according to one embodiment of the present disclosure.

FIG. 5 is a flowchart 500 of operations according to one embodiment of the present disclosure. The flowchart 500 illustrates operations of the general principles of determining the output capacitance value, as may be implemented by the circuitry of FIG. 1 and/or FIG. 3. Operations of this embodiment include beginning a calibration period and charging an output capacitor with a current source to generate an output voltage 502. Operations may also include comparing the output voltage to a reference voltage 504. Operations may also include determining a time period during which the output voltage is less than the reference voltage 506. Operations may also include determining the capacitance value, C, of the output capacitor based on, at least in part, the determined time period 508.

Figure 6:
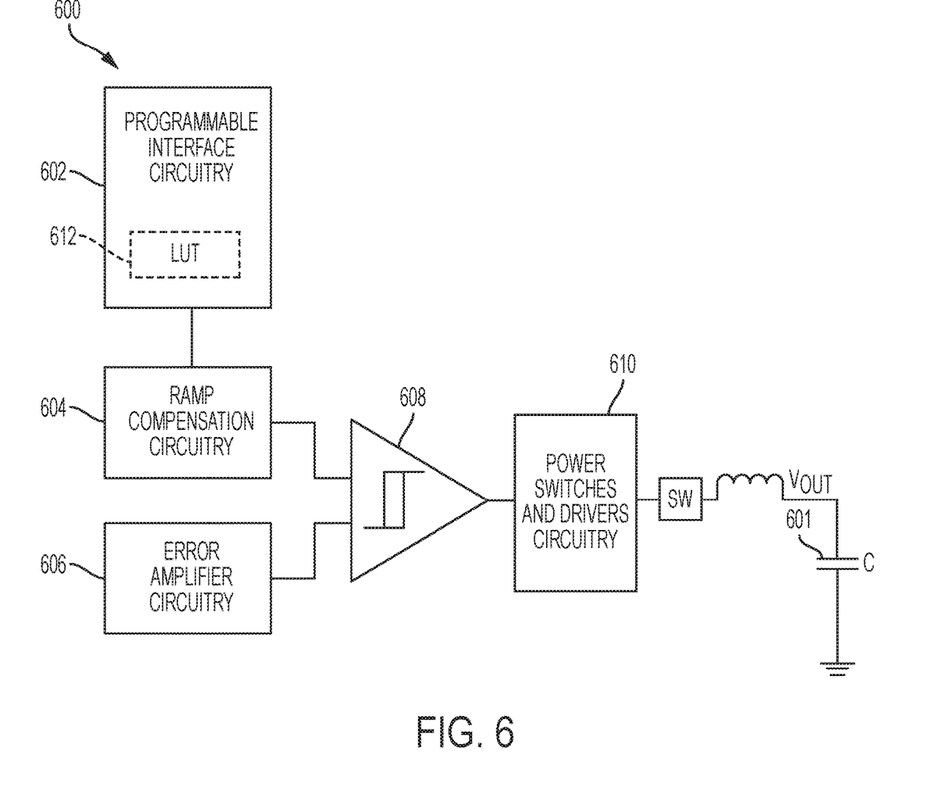
FIG. 6 illustrates a power supply system according to another embodiment of the present disclosure.

II. Adjusting Power Supply Circuit Parameters Using the Output Capacitor C Value FIG. 6 illustrates a power supply system 600 according to another embodiment of the present disclosure. The power supply system 600 of FIG. 6 illustrates simplified circuit features of certain known elements of a conventional switched mode power supply, for example, ramp compensation circuitry 604, error amplifier circuitry 606, hysteresis comparator circuitry 608 and power switches and drivers circuitry 610. Except as provided below, the description of these components is omitted here since, except as provided below, these components are well-known to those skilled the art. The power supply system 600 of this embodiment also includes output transformer, L, and output capacitor 601 coupled to the SW node, similar to the embodiments of FIGS. 1 and 3. It should also be understood that load circuitry (not shown) may be coupled to the output voltage Vout. The ramp compensation circuitry 604 may be viewed as including two elements: DC feedback circuitry which controls the output voltage to meet a desired target, and ramp generation circuitry that controls the on and off time of the power switches. The on-time is the time where the high-side FET (PMOS switch in the Figures) is active and drives up the inductor current and the off-time is the time the low-side FET (NMOS switch in Figures) is active and ramping down the current in the inductor. The construction of the ramp generating circuit is such that should the output voltage drop below the target it will tend to increase the on-time and decrease the off time which will increase the average current in the inductor and raise the output voltage.

The error amplifier circuitry 606 is generally a much slower control loop but more accurate than the ramp compensation circuitry 604. The error amplifier circuitry 606 is generally configured to integrate the error of the output voltage vs the ideal target and moves either up or down the voltage target into the hysteresis comparator circuitry 608. If, for example, the output voltage is tending to be above the target over time the voltage into the output of the hysteresis comparator circuitry 608 will be increased which will decrease the on-time and increase the off-time of the power switches 610, which reduces the average current in the inductor L so that on load current will start to pull down the output voltage closer to the target.

The power supply system 600 of this embodiments also includes programmable interface circuitry 602 generally configured to enable programmable control over certain elements of the ramp compensation circuitry, as described below. The programmable interface circuitry 602 may include, for example, bus circuitry (e.g., I2C, USB, etc.) to enable user-control and access to the ramp compensation circuitry 604. As will be described in detail below, certain elements of the ramp compensation circuitry 604 may be adjusted (e.g., programmed) once an accurate measurement of the output capacitance C is determined (for example, as described above).

Figure 7:
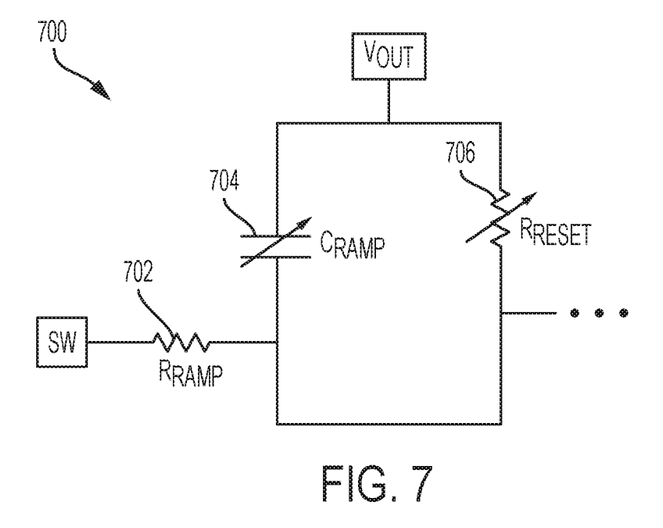
FIG. 7 illustrates ramp compensation circuitry according to one embodiment of the present disclosure.

FIG. 7 illustrates a portion of ramp compensation circuitry 700 according to one embodiment of the present disclosure. The ramp compensation circuitry 700 includes a ramp resistor 704 coupled to the SW node, and a ramp capacitor 704 (Cramp) in parallel with a reset resistor 706 (Rreset) coupled to Vout, as illustrated. In this embodiment, Cramp 704 is an adjustable (variable) capacitor and Rreset 706 is a variable resistor. The capacitance value of the ramp capacitor 704 and/or the resistance value of the reset resistor 706 may be controllably adjusted, based on the load capacitance C, as described below. For a fixed input voltage the ramp resistor 702 is switched between the input voltage and ground independent of the output voltage. On the other hand, the ramp capacitor 704 and the reset resistor 706 are directly coupled to the output voltage, and thus, will adjust the average voltage around which a ramp signal is generated. The ramp capacitor 704 generally enables an immediate response to any output voltage transients, since such voltage transients cannot instantaneously change on the capacitor. In other words, if the output voltage drops quickly then the ramp signal will also drop by the same amount which will extend the on-time because the voltage into positive terminal of the hysteresis comparator circuitry 608 will also drop keeping the high side switch on longer.

In hysteric power supply topologies, as a general matter, the gain of the system may be determined, in large part, based on the ramp compensation circuitry 700. In general terms, the gain may be expressed as:

$G_d*K$; where K is a function of Rreset and Rramp; and where $G_d$ is a function of Rreset*Cramp (where Rreset*Cramp are zeros in the transfer function of the associated equations).

Increasing the gain of the power supply system may enable more accurate control over the output voltage, however, increased gain may cause stability issues, which may manifest themselves as increased ringing during load transients. Output voltage ringing, generally, degrades the quality of the power supply. In general terms, the phase margin of the loop (low phase margin increase ringing) is a function of L*C (where L*C is a pole in the transfer function of this equation). The inventor herein has determined that by setting the values of Rreset and/or Cramp as a function of L*C, the stability of the power supply system may be vastly improved over conventional approaches. In particular, increased stability may be realized using the following equation:

$$Rreset*Cramp=1/SQRT(L*C) \qquad \text{EQ. 3}$$

where SQRT is a square root function.

As mentioned previously, the value of L does not have wide variance between applications, and is typically between 0.47 uH. and 1 uH. For the vast majority of power supply applications, the range of L is likely to be much smaller than the range of capacitance and thus the impact on the stability of the power supply is less of an issue. Accordingly, in the present disclosure, the values for Rreset and/or Cramp may be based on the value of C (assuming a fixed value for L). In some embodiments, the value of Cramp may be fixed and the value of Rreset may be adjusted, once the value of C is determined, to satisfy EQ. 3 above. In other embodiments, the value of Rreset may be fixed and the value of Cramp may be adjusted, once the value of C is determined, to satisfy EQ. 3 above. In still other embodiments, the values of Cramp and Rreset may be adjusted independently, once the value of C is determined to satisfy EQ. 3 above. In these embodiments, and referring again to FIG. 6, the programmable interface circuitry 602 may be utilized to adjust the values of Cramp and/or Rreset, based on the value of C.

The value of C may be determined as described in section (I) above. In other embodiments, the programmable interface circuitry 602 may include a look-up table (LUT) 612 that correlates values for Cramp and/or Rreset for a given value of C. Such an embodiment may be utilized, for example, when the value of C is known and thus may be used as an input to the LUT 612.

While the foregoing is directed to examples of adjusting the ramp compensating circuitry 604, the present disclosure is not limited to hysteretic converter topologies. For example, a current mode converter topology that utilizes current mode control may be used. Current mode control eliminates the impact of the inductor L on the loop dynamics, but the load capacitance in will still influence the performance of the current mode converter. In the current mode converter, the bandwidth of the loop is limited by the pole formed by the output resistance and output capacitance, and the teaching described herein may be used to adjust the dominant pole (compensating pole) such that the bandwidth and phase margin are optimized.

Figure 8:
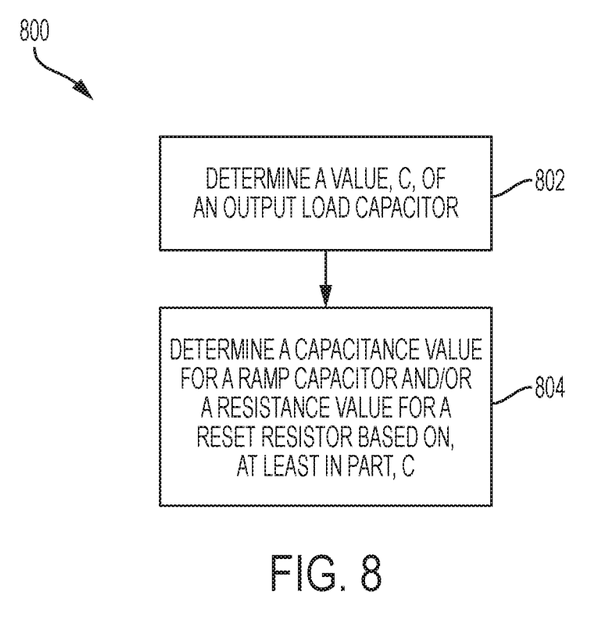
FIG. 8 is a flowchart of operations according to another embodiment of the present disclosure.

FIG. 8 is a flowchart 800 of operations according to another embodiment of the present disclosure. The flowchart 800 illustrates operations of the general principles of determining various parameters of a power supply based on the output load capacitance. Operations of this embodiment include determining a value, C, of an output load capacitor of a power supply 802. This operation may be enabled, for example, using the output load capacitor determination circuitry as described above in section I, and/or using the LUT 612 as described above in section II. Operations of this embodiment may also include determining a capacitance value for a ramp comparing and/or determining a resistance value for a reset resistor based on, at least in part, the output load capacitance 804.

While the flowcharts of FIGS. 5 and 8 illustrate operations according various embodiments, it is to be understood that not all of the operations depicted in FIGS. 5 and 8 are necessary for other embodiments. In addition, it is fully contemplated herein that in other embodiments of the present disclosure, the operations depicted in FIGS. 5 and 8 and/or other operations described herein may be combined in a manner not specifically shown in any of the drawings, and such embodiments may include less or more operations than are illustrated in FIGS. 5 and 8. Thus, claims directed to features and/or operations that are not exactly shown in one drawing are deemed within the scope and content of the present disclosure.

"Circuitry", as used in any embodiment herein, may comprise, for example, singly or in any combination, hardwired circuitry, programmable circuitry, state machine circuitry, and/or firmware that stores instructions executed by programmable circuitry. The circuitry may, collectively or individually, be embodied as elements that form part of a larger system, for example, an integrated circuit (IC), an application-specific integrated circuit (ASIC), a system on-chip (SoC). In some embodiments, the power supply system may be embodied, in part, as an integrated circuit and the output load capacitor and/or output inductor may be provided as separate, discrete external elements to the IC.

Embodiments of the operations described herein may be implemented in a computer-readable storage device having stored thereon instructions that when executed by one or more processors perform the methods. The processor may include, for example, a processing unit and/or programmable circuitry. The storage device may include a machine readable storage device including any type of tangible, non-transitory storage device, for example, any type of disk including floppy disks, optical disks, compact disk read-only memories (CD-ROMs), compact disk rewritables (CD-RWs), and magneto-optical disks, semiconductor devices such as read-only memories (ROMs), random access memories (RAMs) such as dynamic and static RAMs, erasable programmable read-only memories (EPROMs), electrically erasable programmable read-only memories (EEPROMs), flash memories, magnetic or optical cards, or any type of storage devices suitable for storing electronic instructions.

Accordingly, the present disclosure provides a circuit for determining output load capacitance of a power supply that includes a current source controllably coupled to an output load capacitor to charge the output load capacitor to generate an output voltage; comparator circuitry to compare the output voltage to a reference voltage and generate an enable signal; wherein the enable signal is active when the output voltage is less than the reference voltage; counter circuitry to generate a count value of the duration of the enable signal when the enable signal is active; and state machine circuitry to determine a capacitance value of the output load capacitor based on, at least in part, the count value of the enable signal.

The present disclosure also provides a circuit for determining output load capacitance of a power supply that includes a first current source controllably coupled to an output load capacitor to charge the output load capacitor to generate a first output voltage; a second current source controllably coupled to the output load capacitor to discharge the output load capacitor to generate a second output voltage; comparator circuitry to compare the first output voltage to a first reference voltage and a second reference voltage and to generate a first enable signal; wherein the first enable signal is active when the first output voltage is greater than the first reference voltage and less than the second reference voltage; and to compare the second output voltage to the first reference voltage and the second reference voltage and to generate a second enable signal; wherein the second enable signal is active when the second output voltage is greater than the first reference voltage and less than the second reference voltage; counter circuitry to generate a first count value of the duration of the first enable signal when the first enable signal is active, and to generate a second count value of the duration of the second enable signal when the second enable signal is active; and state machine circuitry to determine a capacitance value of the output load capacitor based on, at least in part, the first count value of the first enable signal and the second count value of the second enable signal.

The present disclosure also provides a power supply that includes ramp compensation circuitry to control, at least in part, at least one power switch device of the power supply; the ramp compensation circuitry comprising at least one of a ramp capacitor and/or a reset resistor; a current source controllably coupled to an output load capacitor to charge the output load capacitor to generate an output voltage; comparator circuitry to compare the output voltage to a reference voltage and generate an enable signal; wherein the enable signal is active when the output voltage is less than the reference voltage; counter circuitry to generate a count value of the duration of the enable signal when the enable signal is active; and state machine circuitry to determine a capacitance value of the output load capacitor based on, at least in part, the count value of the enable signal; wherein a capacitance value of the ramp capacitor and/or a resistance value of the reset resistor is based on, at least in part, the capacitance value of the load capacitor.

The present disclosure also provides a power supply that includes ramp compensation circuitry to control, at least in part, at least one power switch device of the power supply; the ramp compensation circuitry comprising at least one of a ramp capacitor and/or a reset resistor; a first current source controllably coupled to an output load capacitor to charge the output load capacitor to generate a first output voltage; a second current source controllably coupled to the output load capacitor to discharge the output load capacitor to generate a second output voltage; comparator circuitry to compare the first output voltage to a first reference voltage and a second reference voltage and to generate a first enable signal; wherein the first enable signal is active when the first output voltage is greater than the first reference voltage and less than the second reference voltage; and to compare the second output voltage to the first reference voltage and the second reference voltage and to generate a second enable signal; wherein the second enable signal is active when the second output voltage is greater than the first reference voltage and less than the second reference voltage; counter circuitry to generate a first count value of the duration of the first enable signal when the first enable signal is active, and to generate a second count value of the duration of the second enable signal when the second enable signal is active; and state machine circuitry to determine a capacitance value of the output load capacitor based on, at least in part, the first count value of the first enable signal and the second count value of the second enable signal; wherein a capacitance value of the ramp capacitor and/or a resistance value of the reset resistor is based on, at least in part, the capacitance value of the load capacitor.

Various features, aspects, and embodiments have been described herein. The features, aspects, and embodiments are susceptible to combination with one another as well as to variation and modification, as will be understood by those having skill in the art. The present disclosure should, therefore, be considered to encompass such combinations, variations, and modifications.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Accordingly, the claims are intended to cover all such equivalents.

What is claimed is:

1. A circuit for determining output load capacitance of a power supply, comprising:
a current source controllably coupled to an output load capacitor to charge the output load capacitor to generate an output voltage;
comparator circuitry to compare the output voltage to a reference voltage and generate an enable signal, wherein the enable signal is active when the output voltage is less than the reference voltage;
counter circuitry to generate a count value of the duration of the enable signal when the enable signal is active; and
state machine circuitry to determine a capacitance value of the output load capacitor based on, at least in part, the count value of the enable signal, wherein the state machine circuitry comprises a look-up table (LUT)

having pre-calculated capacitance values and is configured to determine the capacitance value of the output load capacitor from the LUT.

2. The circuit of claim 1, further comprising clock circuitry that is configured to generate a clock signal, wherein the counter circuitry is further configured to receive the clock signal and generate the count value based on the clock signal.

3. The circuit of claim 1, wherein the reference voltage is selected to minimize load effects of load circuitry coupled to the output load capacitor.

4. The circuit of claim 1, wherein the LUT correlates count values to capacitance values.

5. The circuit of claim 4, wherein the LUT correlates a range of count values to a capacitance value.

6. The circuit of claim 1, wherein the power supply comprises ramp compensation circuitry that includes at least one of a ramp capacitor and/or a reset resistor, and wherein a capacitance value of the ramp capacitor and/or a resistance value of the reset resistor is based on, at least in part, the capacitance value of the output load capacitor.

7. A circuit for determining an output load capacitance of a power supply, comprising:
   a first current source controllably coupled to an output load capacitor to charge the output load capacitor to generate a first output voltage;
   a second current source controllably coupled to the output load capacitor to discharge the output load capacitor to generate a second output voltage;
   comparator circuitry to:
      compare the first output voltage to a first reference voltage and a second reference voltage and to generate a first enable signal, wherein the first enable signal is active when the first output voltage is greater than the first reference voltage and less than the second reference voltage; and
      compare the second output voltage to the first reference voltage and the second reference voltage and to generate a second enable signal, wherein the second enable signal is active when the second output voltage is greater than the first reference voltage and less than the second reference voltage;
   counter circuitry to generate a first count value of a duration of the first enable signal when the first enable signal is active, and to generate a second count value of a duration of the second enable signal when the second enable signal is active; and
   state machine circuitry to determine a capacitance value of the output load capacitor based on, at least in part, the first count value of the duration of the first enable signal and the second count value of the duration of the second enable signal.

8. The circuit of claim 7, further comprising clock circuitry that is configured to generate a clock signal, wherein the counter circuitry is further configured to receive the clock signal and generate the first and second count values based on the clock signal.

9. The circuit of claim 7, wherein the first reference voltage is selected to be above a nominal voltage and the second reference voltage is selected to be greater than the first reference voltage and to minimize load effects of load circuitry coupled to the output load capacitor.

10. The circuit of claim 7, wherein the state machine circuitry further comprises a look-up table (LUT) to correlate the first and second count values to capacitance values.

11. The circuit of claim 10, wherein the LUT correlates a range of first count values to a first capacitance value and a range of second count values to a second capacitance value, and wherein the capacitance value of the output load capacitor is determined by averaging the first capacitance value and the second capacitance value.

12. The circuit of claim 7, wherein the power supply comprises ramp compensation circuitry that includes at least one of a ramp capacitor and/or a reset resistor, and wherein a capacitance value of the ramp capacitor and/or a resistance value of the reset resistor is based on, at least in part, the capacitance value of the output load capacitor.

13. A power supply, comprising:
   ramp compensation circuitry to control, at least in part, at least one power switch device of the power supply, the ramp compensation circuitry comprising at least one of a ramp capacitor and/or a reset resistor;
   a current source controllably coupled to an output load capacitor to charge the output load capacitor to generate an output voltage;
   comparator circuitry to compare the output voltage to a reference voltage and generate an enable signal, wherein the enable signal is active when the output voltage is less than the reference voltage;
   counter circuitry to generate a count value of the a duration of the enable signal when the enable signal is active; and
   state machine circuitry to determine a capacitance value of the output load capacitor based on, at least in part, the count value of the enable signal, wherein a capacitance value of the ramp capacitor and/or a resistance value of the reset resistor is based on, at least in part, the capacitance value of the output load capacitor, and wherein the state machine circuitry comprises a look-up table (LUT) having pre-calculated capacitance values and is configured to determine the capacitance value of the output load capacitor from the LUT.

14. The power supply of claim 13, further comprising clock circuitry that is configured to generate a clock signal wherein the counter circuitry is further configured to receive the clock signal and generate the count value based on the clock signal.

15. The power supply of claim 13, wherein the reference voltage is selected to minimize load effects of load circuitry coupled to the output load capacitor.

16. The power supply of claim 13, wherein the LUT correlates count values to capacitance values.

17. The power supply of claim 16, wherein the LUT correlates a range of count values to a capacitance value.

18. A power supply, comprising:
   ramp compensation circuitry to control, at least in part, at least one power switch device of the power supply, the ramp compensation circuitry comprising at least one of a ramp capacitor and/or a reset resistor;
   a first current source controllably coupled to an output load capacitor to charge the output load capacitor to generate a first output voltage;
   a second current source controllably coupled to the output load capacitor to discharge the output load capacitor to generate a second output voltage;
   comparator circuitry to:
      compare the first output voltage to a first reference voltage and a second reference voltage and to generate a first enable signal, a wherein the first enable signal is active when the first output voltage is greater than the first reference voltage and less than the second reference voltage; and
      compare the second output voltage to the first reference voltage and the second reference voltage and to generate a second enable signal, wherein the second enable signal is active when the second output voltage is greater than the first reference voltage and less than the second reference voltage;

counter circuitry to generate a first count value of a duration of the first enable signal when the first enable signal is active, and to generate a second count value of a duration of the second enable signal when the second enable signal is active; and state machine circuitry to determine a capacitance value of the output load capacitor based on, at least in part, the first count value of the duration of the first enable signal and the second count value of the duration of the second enable signal, wherein a capacitance value of the ramp capacitor and/or a resistance value of the reset resistor is based on, at least in part, the capacitance value of the output load capacitor.

19. The power supply of claim 18, further comprising clock circuitry that is further configured to generate a clock signal wherein the counter circuitry is further configured to receive the clock signal and generate the first and second count values based on the clock signal.

20. The power supply of claim 18, wherein the first reference voltage is selected to be above a nominal voltage and the second reference voltage is selected to be greater than the first reference voltage and to minimize load effects of load circuitry coupled to the output load capacitor.

21. The power supply of claim 18, wherein the state machine circuitry further comprises a look-up table (LUT) to correlate the first and second count values to capacitance values.

22. The power supply of claim 21, wherein the LUT correlates a range of first count values to a first capacitance value and a range of second count values to a second capacitance value, and wherein the capacitance value of the output load capacitor is determined by averaging the first capacitance value and the second capacitance value.

* * * * *

UNITED STATES PATENT AND TRADEMARK OFFICE
CERTIFICATE OF CORRECTION

PATENT NO. : 10,060,954 B2  
APPLICATION NO. : 15/413352  
DATED : August 28, 2018  
INVENTOR(S) : Crawley Page 1 of 1

It is certified that error appears in the above-identified patent and that said Letters Patent is hereby corrected as shown below:

On the Title Page

Please correct the spelling of the name of the Assignee, item (73), as follows:
Assignee: Fairchild Semiconductor Corporation Signed and Sealed this
Fourth Day of December, 2018

Andrei Iancu
*Director of the United States Patent and Trademark Office*